United States Patent
Palangappa et al.

(10) Patent No.: US 12,126,361 B2
(45) Date of Patent: Oct. 22, 2024

(54) TECHNIQUES TO IMPROVE LATENCY OF RETRY FLOW IN MEMORY CONTROLLERS

(71) Applicant: Intel Corporation, Santa Clara, CA (US)

(72) Inventors: Poovaiah M. Palangappa, San Jose, CA (US); Zion S. Kwok, Burnaby (CA); Ravi H. Motwani, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 211 days.

(21) Appl. No.: 17/700,022

(22) Filed: Mar. 21, 2022

(65) Prior Publication Data

US 2022/0209794 A1    Jun. 30, 2022

(51) Int. Cl.
*H03M 13/00* (2006.01)
*G06F 3/06* (2006.01)
*H03M 13/11* (2006.01)
*H03M 13/15* (2006.01)

(52) U.S. Cl.
CPC ........ *H03M 13/159* (2013.01); *G06F 3/0619* (2013.01); *G06F 3/0644* (2013.01); *G06F 3/0659* (2013.01); *G06F 3/0679* (2013.01); *H03M 13/1105* (2013.01); *H03M 13/1177* (2013.01)

(58) Field of Classification Search
CPC .... G06F 3/0659; G06F 11/079; H03M 13/09; H03M 13/03; H03M 13/15; H03M 13/1105; H03M 13/1177
See application file for complete search history.

(56) References Cited

U.S. PATENT DOCUMENTS

| | | | |
|---|---|---|---|
| 6,981,197 B2 * | 12/2005 | Liu | H03M 13/27 714/765 |
| 7,774,687 B2 | 8/2010 | Wu | |
| 8,301,979 B2 | 10/2012 | Sharon et al. | |
| 8,307,260 B2 * | 11/2012 | Ito | G11C 11/4096 714/766 |
| 8,347,191 B1 | 1/2013 | Ran | |
| 8,413,023 B2 * | 4/2013 | Ashe | H03M 13/6343 714/781 |
| 8,694,850 B1 * | 4/2014 | Tang | H03M 13/2948 714/755 |
| 9,054,742 B2 * | 6/2015 | Kwok | H03M 13/1515 |

(Continued)

*Primary Examiner* — Esaw T Abraham
(74) *Attorney, Agent, or Firm* — Compass IP Law PC

(57) ABSTRACT

A memory controller system includes error correction circuitry and erasure decoder circuitry. A retry flow is triggered when the memory controller's error checking and correction (ECC) detects an uncorrectable codeword. Error correction circuitry generates erasure codewords from the codeword with uncorrectable errors. The memory controller computes the syndrome weight of the erasure codewords. For example, the erasure decoder circuitry receives the erasure codewords and computes the syndrome weights. Error correction circuitry orders the erasure codewords based on their corresponding syndrome weights. Then error correction circuitry selects a subset of the codewords, and sends them to erasure decoder circuitry. Erasure decoder circuitry receives the selected codewords and decodes them.

20 Claims, 5 Drawing Sheets

(56) References Cited

U.S. PATENT DOCUMENTS

| | | |
|---|---|---|
| 9,116,822 B2 | 8/2015 | Kaynak et al. |
| 9,294,133 B1 * | 3/2016 | Xie .................... H03M 13/29 |
| 9,323,611 B2 | 4/2016 | Chilappagari et al. |
| 9,477,552 B1 * | 10/2016 | Bentley .............. G11B 20/1833 |
| 9,509,342 B2 | 11/2016 | Vernon |
| 9,959,168 B2 * | 5/2018 | Achtenberg ...... H03M 13/2909 |
| 10,218,789 B2 * | 2/2019 | Yang ..................... G11C 29/52 |
| 10,230,406 B2 | 3/2019 | Zhong et al. |
| 10,547,332 B2 * | 1/2020 | Litsyn ............... H03M 13/2948 |
| 10,567,003 B2 * | 2/2020 | Brueggen ......... H03M 13/6561 |
| 10,879,930 B2 | 12/2020 | Ha et al. |
| 11,005,499 B2 | 5/2021 | Kim et al. |
| 11,726,665 B1 * | 8/2023 | Sabbag ................ G06F 3/0652 |
| | | 711/154 |
| 2010/0287447 A1 * | 11/2010 | Eun .................... G06F 11/1068 |
| | | 714/763 |

\* cited by examiner

TECHNIQUES TO IMPROVE LATENCY OF RETRY FLOW IN MEMORY CONTROLLERS

FIELD

Descriptions are generally related to memory systems, and more particularly, descriptions are related to error checking and correction (ECC).

BACKGROUND

Memory systems employ error checking and correction (ECC) to increase the system's reliability and reduce the risk of system fault and crashes. ECC includes encoding data into codewords and storing the codewords in memory when executing a write command, and decoding the codewords and returning the data when executing a read command. In some systems, when ECC cannot successfully decode a codeword, the memory system triggers a retry flow. In some implementations, the retry flow consists of erasure decoding. In erasure decoding, some elements (bits) in a codeword are replaced by erasures to create an erasure codeword. Then, the decoder performs ECC decoding on the erasure codeword. Replacing elements in a codeword with erasures is also known as erasing those elements.

For example, in some systems, the codewords are distributed across multiple dies, each die including two or more partitions. In some prior systems, the retry flow sequentially decodes all partition erasure codewords. The first partition erasure codeword is created by erasing the bits in the codeword from a starting memory die partition. Then, sequentially going through each partition, an erasure codeword corresponding to that partition is generated and decoded. In another implementation, the retry flow generates and decodes die erasure codewords. The first die erasure codeword is created by erasing the bits in the codeword from a starting memory die. Then, sequentially going through each die, an erasure codeword corresponding to that memory die is generated and decoded. Sometimes, the retry flow first tries all partition erasure codewords, and if unsuccessful, it tries to decode die erasure codewords.

The decoder attempts to decode the erasure codewords until an erasure codeword is decoded successfully or all erasure codewords are exhausted. Applying partition erasure and die erasure and sequentially decoding the erasure codewords could result in large latency that negatively impacts the memory system's quality of service (QoS).

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention and do not necessarily all refer to the same implementation. However, they are also not necessarily mutually exclusive.

Descriptions of certain details and implementations follow, including non-limiting descriptions of the figures, which may depict some or all examples, and well as other potential implementations.

DETAILED DESCRIPTION

As described herein, a memory controller can decode codewords with uncorrectable error checking and correction (ECC) errors with the execution of the retry flow. During the execution of the retry flow, the memory controller computes the syndrome weight of erasure codewords and decodes a subset of the erasure codewords based on their corresponding syndrome weight.

For example, in 3D cross point (3D XPoint™) memories using low-density parity-check (LDPC) encoding, the syndrome weight of a codeword is correlated with the probability of successful decoding. The smaller the syndrome weight of a codeword, the more likely the erasure decoder can successfully decode that codeword. The retry flow first tries to decode the erasure codewords with smaller syndrome weights instead of indiscriminately and exhaustively trying to decode the erasure codewords. By decoding the erasure codewords with smaller syndrome weights, the retry flow reduces the latency of decoding uncorrectable ECC errors because the retry flow first decodes the erasure codewords that are more likely to be decoded successfully.

The memory controller can combine the syndrome weights of the erasure codewords with other information to select a subset of erasure codewords. In one example, the memory controller may receive information from the firmware or operating system about a specific memory die, indicating that the memory die is likely to be corrupted or faulty. Such information about a potentially corrupted or faulty die can be referred to as a hint, and the memory die indicated by the hint can be referred to as a hint die. In one example, the memory controller may receive information from the firmware, or the operating system about a specific memory partition in a memory die, indicating that the memory partition is likely to be corrupted or faulty. Such a memory partition indicated by a hint can be referred to as a hint partition.

A binary codeword in some implementations can have logical and physical representations. The logical representation of a binary codeword includes an array of bits with logical values of 0s and 1s. One example of the physical implementation of a logical codeword could be a register that has one memory unit for every bit in the binary codeword. The logical 0's and 1's are physically stored in the register in different voltages, magnetic polarizations or orientations, or spin of electrons. For simplicity, reference herein to a codeword refers to a logical binary representation of such codeword with the understanding of different possible physical implementations.

Figure 1:
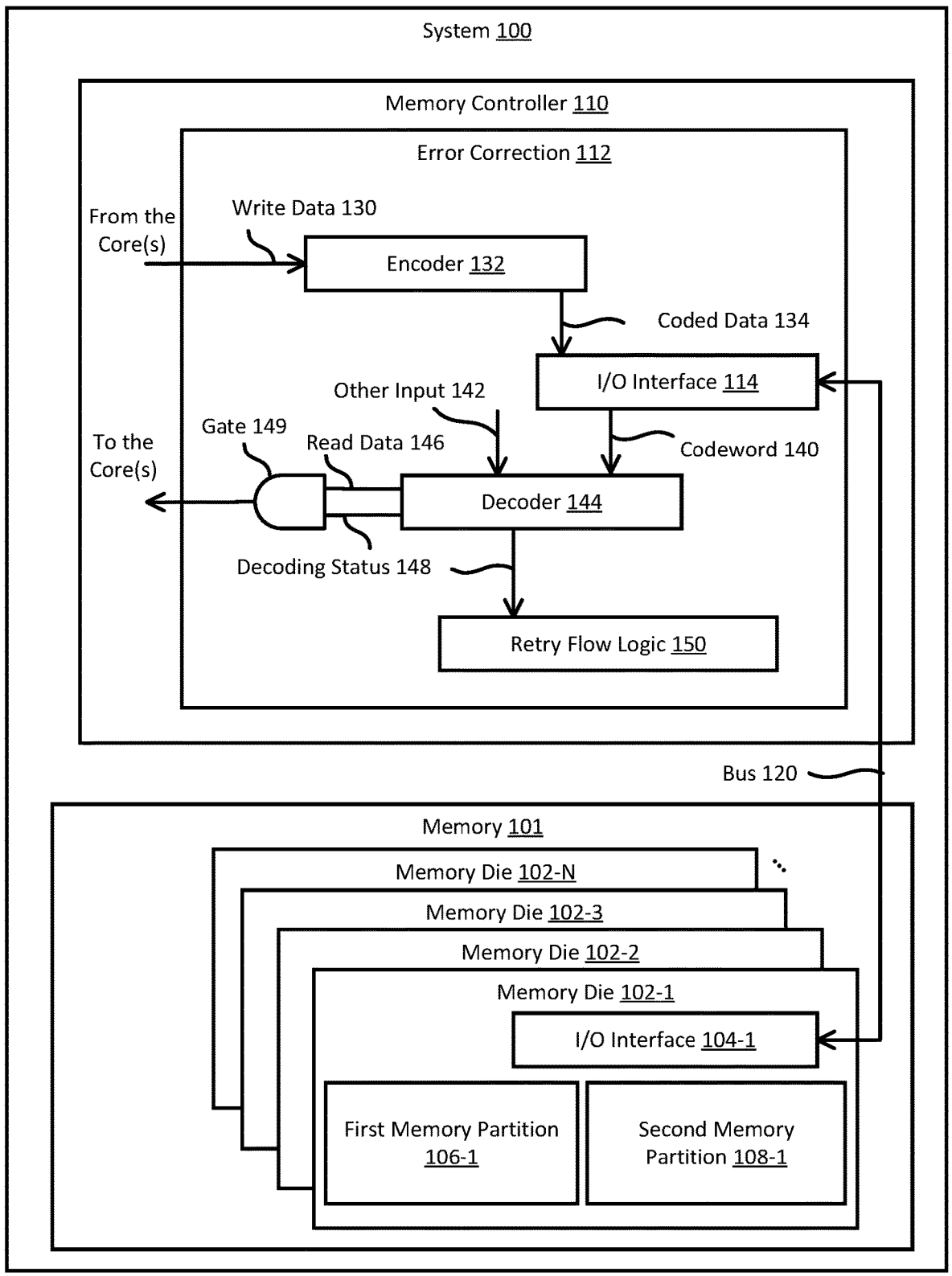
FIG. 1 is a block diagram of an example of a system with a memory controller using the retry flow.

FIG. 1 is a block diagram of an example of system 100 with memory controller 110 using the retry flow. Memory controller 110 includes error correction 112. In one example, error correction 112 is implemented in hardware. In another example, error correction 112 is implemented in both hardware and software.

In one example implementation, error correction 112 includes encoder 132. In one example, encoder is implemented in hardware. In another example, encoder 132 is implemented in hardware and software. Encoder 132 receives write data 130 and encodes write data 130 to generate coded data 134. Memory controller 110 sends coded data 134 to memory 101 via I/O interface 114. Memory 101 stores coded data 134 in memory dies 102-1, 102-2, 102-3, . . . , 102-N.

Memory 101 includes N memory dies 102-1, 102-2, 102-3, . . . , 102-N, collectively referred to as memory dies 102. In one example, each memory die includes two partitions as shown in FIG. 1. In one example, each memory die 102 includes I/O interface 104, first memory partition 106, and second memory partition 108. For example, memory die 102-1 includes I/O interface 104-1, first memory partition 106-1, and second memory partition 108-1. Similarly, memory die 102-N includes I/O interface 104-N, first partition 106-N, and second memory partition 108-N.

Memory controller 110 is communicatively coupled with memory 101 through bus 120. Bus 120 is communicatively coupled with I/O interface 114 in memory controller 110 and I/O interface 104 in memory dies 102.

In one example, memory 101 is a non-volatile, e.g., 3D cross point (3D XPoint™), memory. In different implementations, memory dies 102 could include a different number of memory dies, e.g., 2, 4, 10, or 20 dies.

In one example, coded data 134 is stored in a distributed manner across multiple memory dies 102. Distribution of coded data 134 across multiple dies improves the concurrent read latency. For instance, in one example implementation, coded data 134 could spread across all or some of the dies. For example, in a system with N memory dies 102, the memory controller 110 could spread coded data 134 over M memory dies, where M is equal to or smaller than N.

In one example, encoder 132 implements a linear code to encode write data 130. Examples of linear code used by encoder 132 include but are not limited to low-density parity-check (LDPC) codes, Hoffman codes, Reed-Solomon codes, repetition codes, parity codes, turbo codes, or other linear codes.

When the information is needed from memory, bits of coded data 134 distributed among memory dies 102 are put together to form a codeword 140. Memory 101 sends codeword 140 to memory controller 110 through I/O interface 104, 114, and bus 120. Decoder 144 receives codeword 140 and decodes it to generate read data 146. Successful decoding of codeword 140 enables gate 149 through decoding status signal 148, and memory controller 110 returns read data 146 to the entity requesting it (e.g., a central processing unit, a graphical processing unit, data processing unit).

In some implementations, decoder 144 can perform decoding algorithms such as belief propagation algorithm, Viterbi algorithm, the BCJR, log-likelihood decoding, maximum a posteriori probability, and other decoding techniques. In one example, decoder 144 is implemented in hardware circuitry. In another example, decoder 144 is implemented in logic, including both hardware and software components.

Decoder 144 operates on codeword 140. In one example, decoder 144 implements hard decoding. In hard decoding, the bits in codeword 140 take on a fixed set of possible values (typically 0 or 1 in a binary code). In another example, decoder 144 implements soft decoding. The information bits in codeword 140 can take on a range of values in soft decoding. Soft decoding considers the reliability of each bit in codeword 140.

In one example implementation, memory 101 stores the logical value 0 of a bit with equivalent physical value 1, and logical value 1 of a bit with equivalent physical value −1. Because of uncertainty and noise, when a bit from memory is read, the read value takes a wide range of values. When reading a bit from memory in a system using hard-values, the read value is mapped to one of the two possible values 0, or 1, or to 1 and −1 in a different implementation. In a soft-value system, the read value is represented by a log likelihood ratio, which is an indication of certainty in the value being 0 or 1.

Decoder 144 detects an uncorrectable codeword when it cannot decode codeword 140. Decoder 144 generates decoding status signal 148 which indicates that the error in the codeword is uncorrectable with an error checking and correction (ECC) code. In one example, decoding status signal 148 indicates an uncorrectable error and triggers retry flow logic 150.

In one example, other input 142 carries information used by decoder 144. For example, other input 142 can configure decoder 144 whether to implement hard-decision or soft-decision decoding. In another example, other input 142 can include partition hints or die hints.

In one example, retry flow logic 150 computes the syndrome weight for each erasure codeword and selects a subset of erasure codewords with the smallest absolute value syndrome weights (not considering the sign of the syndrome weight). Then, starting with the erasure codeword with the smallest syndrome weight in the selected subset, the erasure decoder decodes the selected erasure codewords one by one until one of the codewords is successfully decoded or all the selected erasure codewords are tried by the decoder.

Figure 2:
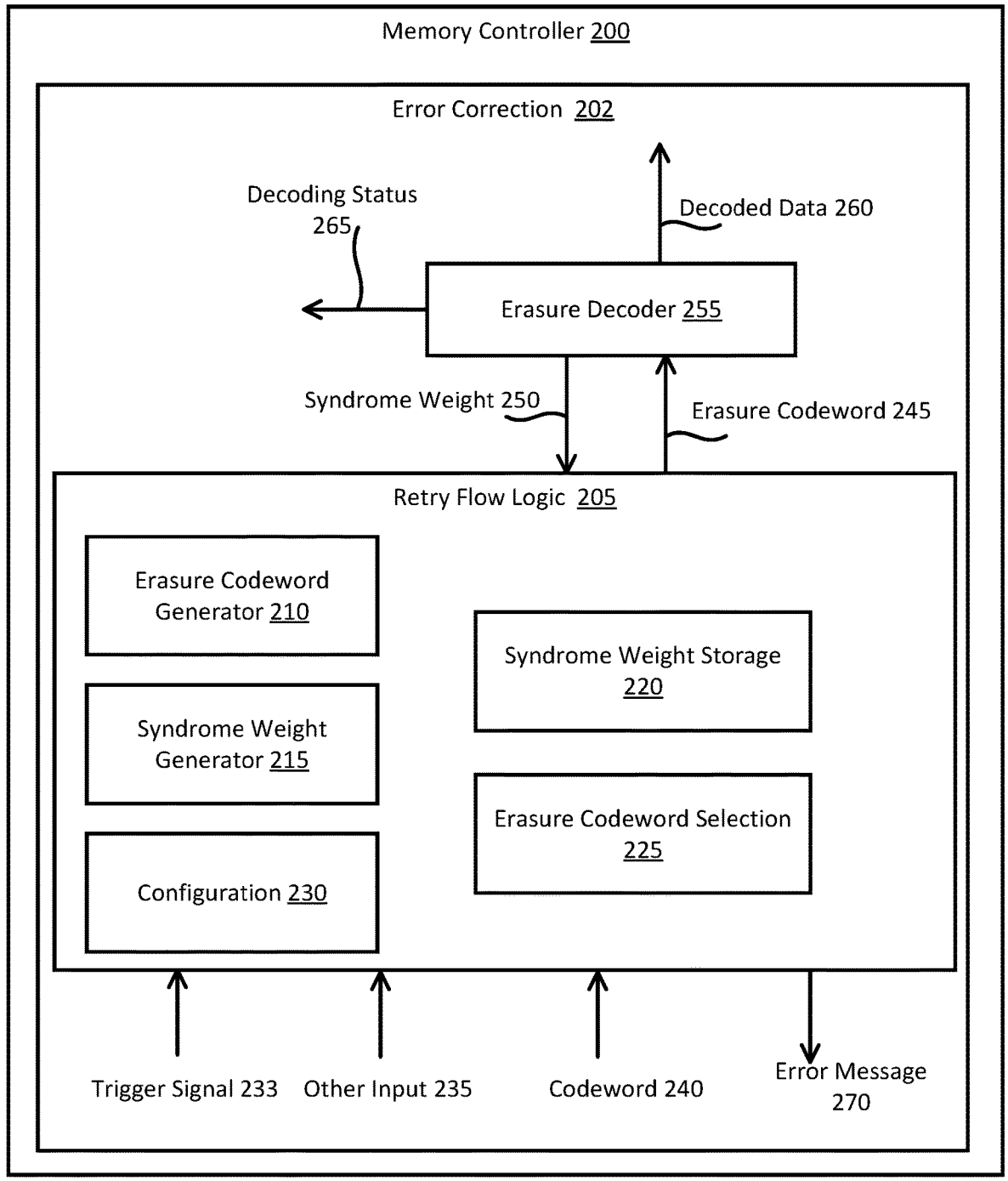
FIG. 2 is a block diagram of an example of a memory controller, including error correction and retry flow logic.

FIG. 2 is a block diagram of an example of memory controller 200, including error correction 202 and retry flow logic 205. Retry flow logic 205 generates erasure codewords at erasure codeword generator 210, computes syndrome weights at syndrome weight generator 215, sorts and stores syndrome weights at syndrome weight storage 220, and selects a subset of erasure codewords to be decoded at erasure codeword selection 225. Configuration 230 configures retry flow logic 205 operational parameters including but not limited to: criteria for selecting erasure codewords, number of erasure codewords to be selected, soft or hard decision criteria for decoding, and information regarding hint partition(s) and hint die(s).

In one example, retry flow logic 205 generates a plurality of erasure codewords from codeword 240 when the decoder (e.g., decoder 144 in FIG. 1) could not decode codeword 240. In one example, erasure codeword selection 225 selects the erasure codewords based on the syndrome weights of the erasure codewords. In one example, erasure decoder 255 can perform two operations: in one operation, erasure decoder 255 computes the syndrome weights of the plurality of erasure codewords 245, and in another operation, it decodes erasure codeword 245.

In one example, erasure decoder 255 is communicatively coupled with retry flow logic 205. Erasure decoder 255 receives erasure codeword 245 from retry flow logic 205. In one example implementation, erasure decoder 255 is used to compute the syndrome vector and syndrome weight of erasure codeword 245. For example, when erasure decoder 255 implements iterative belief propagation algorithms to decode LDPC codewords, the first iteration of the decoding algorithm can be applied to a codeword to generate the syndrome weight of that codeword. In one example implementation, the syndrome weights are computed from the syndrome vector. For example, in one implementation, the syndrome weight is the absolute value of the sum of the elements of the syndrome vector.

Retry flow logic 205 receives trigger signal 233 and codeword 240 when memory controller 200 (or memory controller 110 in FIG. 1) cannot decode codeword 240. Erasure codeword generator 210 generates erasure codewords from codeword 240. In one example, some of the elements (also referred to as bits or components) in codeword 240 are erased to generate an erasure codeword. An element in a codeword is erased when an erasure value replaces its value. For example, when bits in a codeword are either 0 or 1, in a hard-decision representation of the codeword, an erasure would be a value that is neither 0 nor 1. The erasure value of a bit in an erasure codeword indicates to the decoder that there is uncertainty about the value of that bit. The erasure bit is equally likely 0 or 1. In another example, the erasure could be a value that the decoder could interpret to be 0 or 1 equally. In another example, when bits of codeword 240 are log-likelihood ratios, an erasure codeword can be created by replacing a bit in codeword 240 by value 0, i.e., a value indicating that the bit could be equally likely 0 or 1.

In one example, erasure codeword generator 210 generates partition erasure codewords. A partition erasure codeword is generated by erasing the group of elements (bits) in codeword 240 retrieved or obtained from the same partition. For each memory partition (e.g., memory partitions 106 and 108 of memory 101 in FIG. 1), erasure codeword generator 210 generates one erasure codeword by replacing the group of elements in codeword 240 from that partition with erasures.

In one example, erasure codeword generator 210 generates die erasure codewords. A die erasure codeword is generated by erasing the group of elements (bits) in codeword 240 retrieved or obtained from the same memory die. For each memory die in the memory (e.g., memory dies 102 of memory 101 in FIG. 1), erasure codeword generator 210 generates one erasure codeword by replacing the group of elements in codeword 240 from that memory die with erasures.

In one example, syndrome weight generator 215 computes the syndrome weight of each erasure codeword, and syndrome weight storage 220 stores the syndrome weights. In one example, erasure decoder 255 computes the syndrome weight of erasure codewords.

In one example, retry flow logic 205 sends each erasure codeword 245 to erasure decoder 255. Erasure decoder 255 computes syndrome weight 250 and sends it to retry flow logic 205. Syndrome weight storage 220 receives and stores syndrome weight 250 for all erasure codewords. In one example, erasure decoder 255 performs one iteration of the belief propagation algorithm of LDPC decoding to compute syndrome weight 250 of erasure codeword 245. In another example, erasure decoder 255 performs two or more iterations of the belief propagation algorithm of LDPC decoding to compute syndrome weight 250 of erasure codeword 245. In another example, erasure decoder 255, or syndrome weight generator 215, compute the syndrome weight of an erasure codeword using the parity check matrix or generator matrix of the ECC code used in encoding to generate codeword 240.

In one example, erasure codeword selection 225 selects a subset of all the erasure codewords. In some example implementations, the erasure codeword selection 225 selects five, seven, or nine erasure codewords with the smallest syndrome weights. In one example, retry flow logic 205 receives other input 235. In one example, other input 235 includes information about hint partitions or hint dies. Erasure codeword selection 225 can use hint partitions and hint dies information in selecting the subset of erasure codewords. In another example, erasure codeword selection 225 can ignore hint partitions, and hint dies information received. In one example, other input signal 235 and configuration 230 configure retry flow logic 205 and erasure codeword selection 225 whether to use the hint partitions and hint dies information in selecting erasure codewords. In one example, erasure codeword selection 225 selects erasure codewords with syndrome weights smaller than a threshold where the threshold is configured in configuration 230 and is set by other input signal 235. In another example, erasure codeword selection 225 can be configured, e.g., by configuration 230 or other input 235, to have one threshold for syndrome weights of partition erasure codewords and another threshold for syndrome weights of die erasure codewords. In one example implementation, the threshold for syndrome weights of partition erasure codewords can be set to zero (0). Since all syndrome weights are larger than zero (if the computation of syndrome weights returns a negative number, it is replaced by its absolute value), setting the threshold for partition erasure codewords to zero would disable the selection of partition erasure codewords. Similarly, in one example, the threshold for syndrome weight of die erasure codewords can be set to zero, eliminating consideration of die erasure codewords for decoding.

In one example, configuration 230 configures erasure codeword generator 210 to only generate partition erasure codewords. In another example, configuration 230 configures erasure codeword generator 210 to only generate die erasure codewords. In one example, configuration 230 configures syndrome weight generator 215 to only generate syndrome weight of partition erasure codewords. In another example, configuration 230 configures syndrome weight generator 215 to only generate syndrome weights of die erasure codewords.

In one example, erasure codeword selection 225 sends the selected erasure codeword 245 from the selected subset of erasure codewords to erasure decoder 255. If erasure decoder 255 successfully decodes erasure codeword 245, it returns decoded data 260 to the entity requesting it, and decoding status signal 265 indicates successful decoding and terminates the retry flow. However, if erasure decoder 255 could not decode erasure codeword 245, decoding status signal 265 informs retry flow logic 205, and erasure codeword selection 225 sends the next erasure codeword 245 from the selected subset of erasure codewords to erasure decoder 255.

In one example, the memory (e.g., memory 101 in FIG. 1) includes N memory dies (e.g., memory dies 102 in FIG. 1), each memory die with M partitions per die. There are N×M (N multiplied by M) memory partitions. In one example, erasure codeword generator 210 generates N×M partition erasure codewords, syndrome weight generator 215 generates N×M syndrome weights, syndrome weight storage 220 sorts and stores N×M syndrome weights, and erasure codeword selection 225 selects K of erasure codewords (e.g., corresponding to the K smallest syndrome weights). In one example, erasure codeword generator 210 generates N die erasure codewords, syndrome weight generator 215 generates N syndrome weights, syndrome weight storage 220 sorts and stores N syndrome weights, and erasure codeword selection 225 selects L of erasure codewords (e.g., corresponding to the L smallest syndrome weights). In one example, erasure codeword generator 210 generates N die erasure codewords and N×M partition erasure codewords, syndrome weight generator 215 generates N+N×M syndrome weights, syndrome weight storage 220 sorts and stores N+N×M syndrome weights, and erasure codeword selection 225 selects P of erasure codewords (e.g., corresponding to the P smallest syndrome weights).

In one example, the syndrome weight indicates a codeword's bit error rate. A codeword with high syndrome weight will likely result in an ECC decode failure. A first codeword is decoded before a second codeword when the first codeword has a syndrome weight that is smaller than the syndrome weight of the second codeword.

In one example, configuration 230 configures erasure codeword selection 225 to select at most Y many erasure codewords. Erasure codeword selection 225 sends each selected codeword to erasure decoder 255. If erasure decoder 255 received all Y erasure codewords and did not successfully decode any of them, retry flow logic 205 would trigger an uncorrectable error message by sending error message 270.

In one example, syndrome weight storage 220 is a set of fast storage such as registers. In another example, syndrome weight storage 220 is a scratchpad memory, a high-speed internal memory used for temporary data storage.

Figure 3:
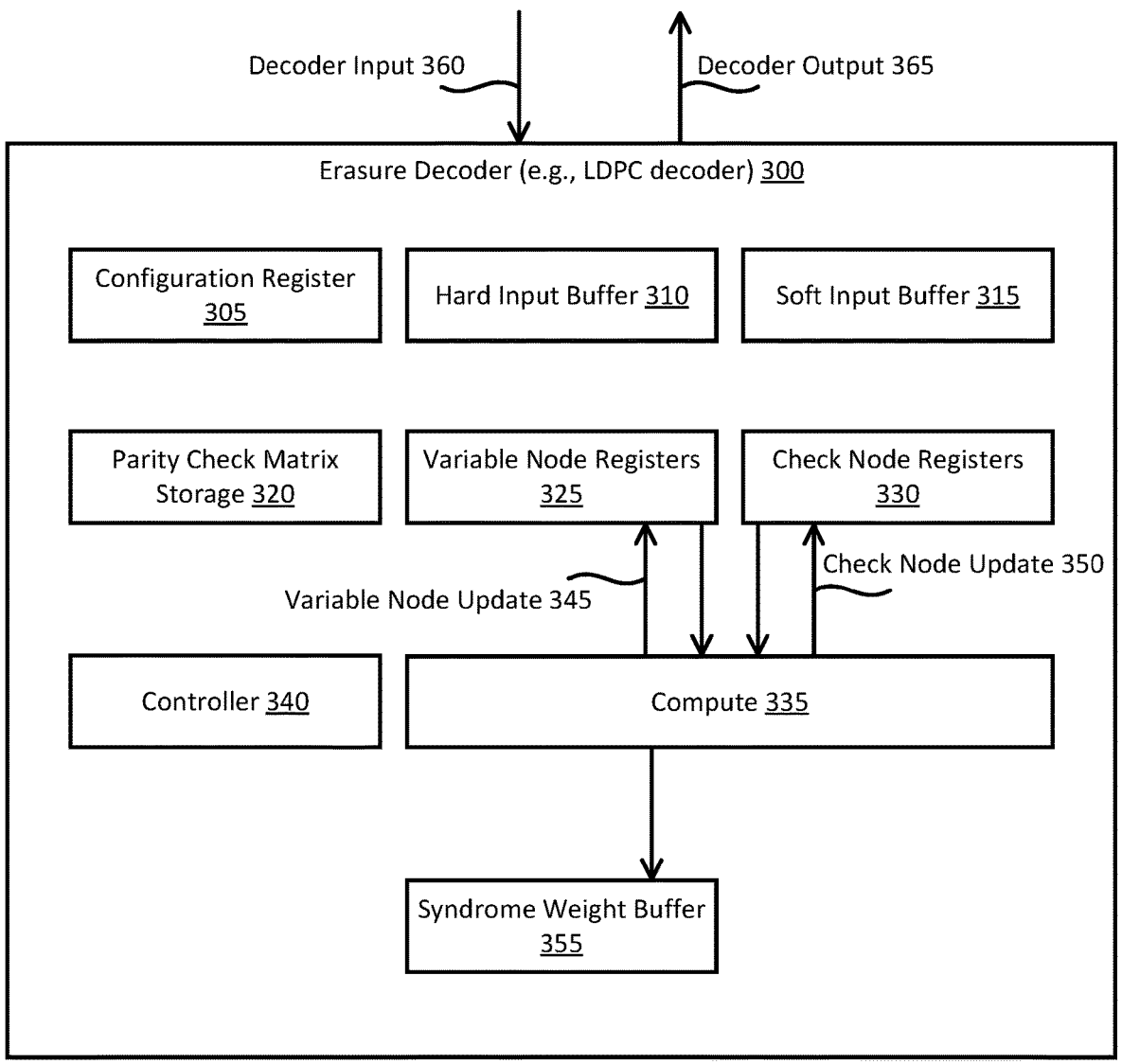
FIG. 3 is a block diagram of an example of an erasure decoder.

FIG. 3 is a block diagram of an example of an erasure decoder 300, such as a low-density parity-check (LDPC) decoder. Compute 335 is the primary processing and compute unit in erasure decoder 300. In one example, compute 335 executes decoding algorithms. In one example, compute 335 is implemented in hardware. In another example, compute 335 is implemented in hardware and software.

In one example, the decoding algorithm is implemented in software. In another example, the decoding algorithm is implemented in hardware. In another example, the decoding algorithm is implemented in both hardware and software.

In some example implementations, compute 335 performs decoding algorithms including and not limited to: belief propagation algorithm, Viterbi algorithm, the BCJR (a maximum a posteriori probability decoding named after its inventors Bahl-Cocke-Jelinek-Raviv) algorithm, log-likelihood decoding, maximum a posteriori probability, and other decoding techniques.

In one example, compute 335 computes the syndrome weight of the codeword. In one example implementation, compute 335 receives the parity check matrix or the generator matrix from parity check matrix storage 320 and the codeword from hard input buffer 310 or soft input buffer 315 and computes the syndrome weight of the codeword. Compute 335 sends the syndrome weight buffer to syndrome weight buffer 355 to be stored.

Decoder input 360 includes all the information that erasure decoder 300 receives. In one example implementation, erasure decoder 300 receives the codeword from decoder input 360. Information carried by decoder input 360 includes some of the following signals and information but is not limited to this list: parity check matrix, generator matrix, configuration parameters, hard-decision codeword, and soft-decision codeword. In one example, the hard-decision codeword is stored in hard input buffer 310. In another example, the soft-decision codeword is stored in soft input buffer 315.

Configuration register 305 stores and configures the operation of erasure decoder 300. In one example, configuration register 305 determines the decoding algorithm used by compute 335. In another example, configuration register 305 determines whether to use hard-decision decoding or soft-decision decoding.

In one example, compute 335 implements a belief propagation algorithm to decode LDPC codes. The belief propagation algorithm is an iterative algorithm. Compute 335 receives data from variable node registers 325 and check node registers 330 and computes the parities. Compute 335 updates the variable node registers by variable node update signal 345 and updates check node registers 330 by check node update signal 350. Compute 335 repeats the above steps with the updated variable node registers 325 and check node registers 330 until the algorithm reaches stopping criteria. In one example, the initial values of variable node registers 325 and check node registers 330 are elements of the codeword to be decoded and are obtained from buffers 310 or 315.

In one example, the first iteration of the belief propagation algorithm computes the syndrome vector of the codeword. In another example, compute 335 computes the syndrome vector using the codeword and the parity check matrix of the LDPC code. Compute 335 uses the syndrome vector to compute the syndrome weight of the codeword. Syndrome weight buffer 355 stores the syndrome weight of the codeword.

Controller 340 monitors and controls the operation of erasure decoder 300. In one example, controller 340 enables the flow of information among other components, e.g., setting and resetting variable node registers 325 or check node registers 330. In another example, controller 340 implements scheduling algorithms for compute 335. In one example, controller 340 schedules and manages decoder input 360 and decoder output 365.

Decoder output 365 includes all the information going out of erasure decoder 300. Decoder output 365 includes the following information but is not limited to this list: the syndrome weight of the input codeword, decoding status indicating whether decoding was successful, and decoded data in case of successful decoding.

Figure 4:
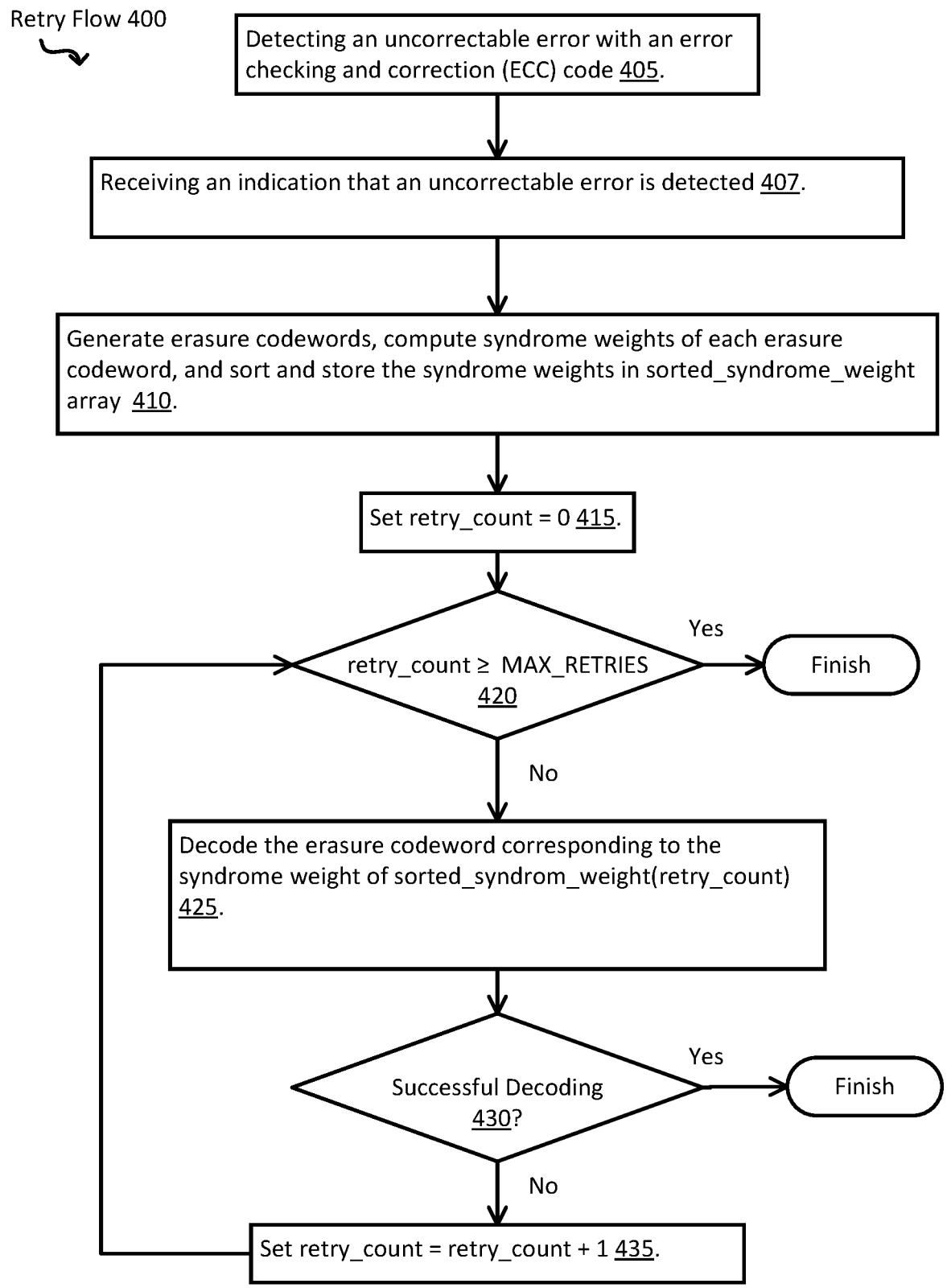
FIG. 4 is a flow diagram of an example of a process for a system implementing the retry flow.

FIG. 4 is a flow diagram of an example of a process for a system implementing the retry flow 400. In Box 405, the memory controller detects an uncorrectable error. An uncorrectable error is an error that cannot be corrected with an error checking and correction (ECC) code. Once the ECC decoder in the memory controller fails to decode a codeword, the memory controller activates the retry flow 400. In one example, when a codeword has an error that is uncorrectable with an error checking and correction code, the decoder sends a signal to the retry flow logic to initiate retry flow 400. In box 407 the retry flow 400 receives an indication that the memory controller has detected an uncorrectable error. Box 410 describes the processes of generating erasure codewords, computing syndrome weights of each erasure codeword, and sorting and storing the syndrome weights in sorted_syndrome_weight array. The first element of the sorted_syndrome_weight array is the smallest syndrome weight, and the array is sorted in ascending order.

In one example, retry flow 400 only generates partition erasure codewords. In another example, retry flow 400 only generates die erasure codewords. In another example, retry flow 400 generates both partition erasure and die erasure codewords.

In one example, the sorted_syndrome_weight array only includes the syndrome weights of die erasure codewords. In another example, the sorted_syndrome_weight array only includes the syndrome weights of partition erasure codewords.

Moving on to box 415 from box 410. Retry flow 400 prepares to enter into an iterative process by initializing a counter. In box 415, the variable retry_count is set to zero.

The variable retry_count keeps track of the number of erasure codewords sent to the erasure decoder.

Moving to box 420 from box 415. In one example, retry flow 400 implements the exit criteria by comparing the variable retry_counter with a pre-configured threshold MAX_RETRIES. The threshold MAX_RETRIES determines the number of erasure codewords sent to the erasure decoder. Once the number of times erasure codewords are decoded is equal to or greater than the threshold MAX_RETRIES, the retry flow 400 terminates the procedure. In one example implementation, MAX_RETRIES is equal to five (5), although any maximum can be set consistent with the system configuration, memory architecture, acceptable compute times, or other factors affecting system performance. If retry_counter is not greater than MAX_RETRIES, the retry flow moves to box 425.

In box 425, the erasure decoder receives the erasure codewords corresponding to the syndrome weight of Nth element of sorted_syndrome_weight array, where N is equal to the retry_count. In some implementations, the indexing of elements of an array starts from zero. For example, the first element of the array is indexed by the number 0. The erasure decoder attempts to decode the erasure codeword.

Moving from box 425 to 430. In box 430, retry flow 400 examines whether decoding the erasure codeword in box 425 was successful. If the decoding was successful, the retry flow is terminated, and retry flow 400 returns the decoded data to the entity requesting it. If the decoding was not successful, in box 435, retry flow 400 increases the value of retry_counter by one, and the process repeats from box 420.

Figure 5:
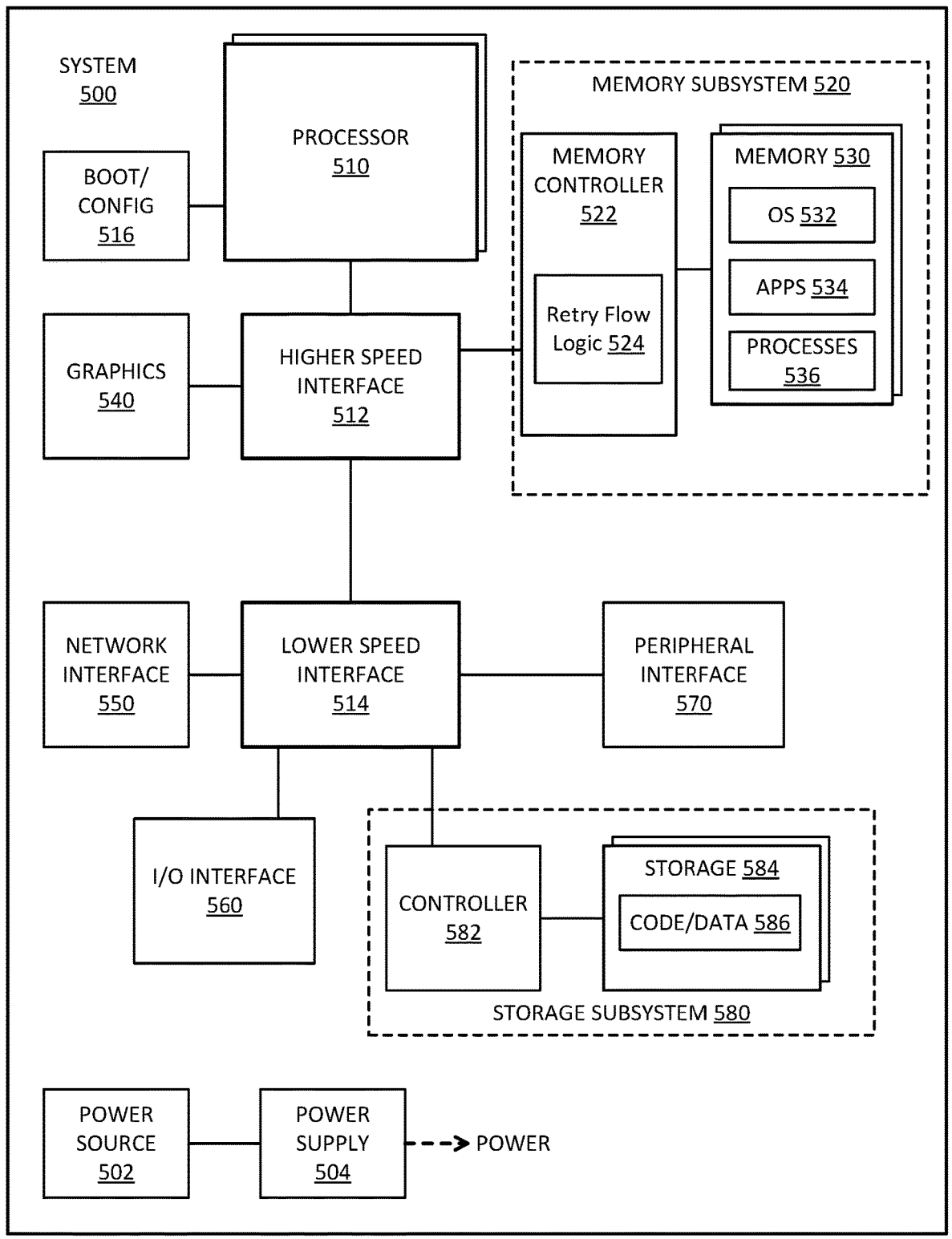
FIG. 5 is a block diagram of an example of a computing system that can include a memory controller using the retry flow.

FIG. 5 is a block diagram of an example of a computing system that can include a memory controller using the retry flow. System 500 represents a computing device in accordance with any example herein and can be a laptop computer, a desktop computer, a tablet computer, a server, a gaming or entertainment control system, an embedded computing device, or other electronic devices.

In one example, memory controller 522 of system 500 includes retry flow logic 524 to perform the retry flow when memory controller 522 fails to decode coded data. In one example, retry flow logic 524 includes an error correction module that generates and selects erasure codewords based on their syndrome weights and an erasure decoder circuitry that generates the syndrome weight of erasure codewords and decodes the erasure codewords.

System 500 includes processor 510 can include any type of microprocessor, central processing unit (CPU), graphics processing unit (GPU), processing core, or other processing hardware, or a combination, to provide processing or execution of instructions for system 500. Processor 510 can be a host processor device. Processor 510 controls the overall operation of system 500 and can be or include one or more programmable general-purpose or special-purpose microprocessors, digital signal processors (DSPs), programmable controllers, application-specific integrated circuits (ASICs), programmable logic devices (PLDs), or a combination of such devices.

System 500 includes boot/config 516, which represents storage to store boot code (e.g., basic input/output system (BIOS)), configuration settings, security hardware (e.g., trusted platform module (TPM)), or other system-level hardware that operates outside of a host OS (operating system). Boot/config 516 can include a non-volatile storage device, such as read-only memory (ROM), flash memory, or other memory devices.

In one example, system 500 includes interface 512 coupled to processor 510, which can represent a higher speed interface or a high throughput interface for system components that need higher bandwidth connections, such as memory subsystem 520 or graphics interface components 540. Interface 512 represents an interface circuit, which can be a standalone component or integrated onto a processor die. Interface 512 can be integrated as a circuit onto the processor die or integrated as a component on a system on a chip. Where present, graphics interface 540 interfaces to graphics components for providing a visual display to a user of system 500. Graphics interface 540 can be a standalone component or integrated onto the processor die or system on a chip. In one example, graphics interface 540 can drive a high definition (HD) display or ultra high definition (UHD) display that provides an output to a user. In one example, the display can include a touchscreen display. In one example, graphics interface 540 generates a display based on data stored in memory 530 or based on operations executed by processor 510 or both.

Memory subsystem 520 represents the main memory of system 500 and provides storage for code to be executed by processor 510 or data values to be used in executing a routine. Memory subsystem 520 can include one or more varieties of random-access memory (RAM) such as DRAM, 3DXP (three-dimensional crosspoint), or other memory devices, or a combination of such devices. Memory 530 stores and hosts, among other things, operating system (OS) 532 to provide a software platform for executing instructions in system 500. Additionally, applications 534 can execute on the software platform of OS 532 from memory 530. Applications 534 represent programs with their own operational logic to execute one or more functions. Processes 536 represent agents or routines that provide auxiliary functions to OS 532 or one or more applications 534 or a combination. OS 532, applications 534, and processes 536 provide software logic to provide functions for system 500. In one example, memory subsystem 520 includes memory controller 522, which is a memory controller to generate and issue commands to memory 530. It will be understood that memory controller 522 could be a physical part of processor 510 or a physical part of interface 512. For example, memory controller 522 can be an integrated memory controller, integrated onto a circuit with processor 510, such as integrated onto the processor die or a system on a chip.

While not explicitly illustrated, it will be understood that system 500 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other buses, or a combination.

In one example, system 500 includes interface 514, which can be coupled to interface 512. Interface 514 can be a lower speed interface than interface 512. In one example, interface 514 represents an interface circuit, which can include standalone components and integrated circuitry. In one example, multiple user interface components, peripheral components, or both are coupled to interface 514. Network interface 550 provides system 500 the ability to communicate with remote devices (e.g., servers or other computing devices) over one or more networks. Network interface 550 can include an Ethernet adapter, wireless interconnection components, cellular network interconnection components, USB (universal serial bus), or other wired or wireless standards-based or proprietary interfaces. Network interface 550 can exchange data with a remote device, which can include sending data stored in memory or receiving data to be stored in memory.

In one example, system 500 includes one or more input/output (I/O) interface(s) 560. I/O interface 560 can include one or more interface components through which a user interacts with system 500 (e.g., audio, alphanumeric, tactile/touch, or other interfacings). Peripheral interface 570 can include any hardware interface not specifically mentioned above. Peripherals refer generally to devices that connect dependently to system 500. A dependent connection is one where system 500 provides the software platform or hardware platform or both on which operation executes and with which a user interacts.

In one example, system 500 includes storage subsystem 580 to store data in a non-volatile manner. In one example, in certain system implementations, at least certain components of storage 580 can overlap with components of memory subsystem 520. Storage subsystem 580 includes storage device(s) 584, which can be or include any conventional medium for storing large amounts of data in a nonvolatile manner, such as one or more magnetic, solid state, NAND, 3DXP, or optical based disks, or a combination. Storage 584 holds code or instructions and data 586 in a persistent state (i.e., the value is retained despite interruption of power to system 500). Storage 584 can be generically considered to be a "memory," although memory 530 is typically the executing or operating memory to provide instructions to processor 510. Whereas storage 584 is nonvolatile, memory 530 can include volatile memory (i.e., the value or state of the data is indeterminate if power is interrupted to system 500). In one example, storage subsystem 580 includes controller 582 to interface with storage 584. In one example, controller 582 is a physical part of interface 514 or processor 510 or can include circuits or logic in both processor 510 and interface 514.

Power source 502 provides power to the components of system 500. More specifically, power source 502 typically interfaces to one or multiple power supplies 504 in system 500 to provide power to the components of system 500. In one example, power supply 504 includes an AC to DC (alternating current to direct current) adapter to plug into a wall outlet. Such AC power can be renewable energy (e.g., solar power) power source 502. In one example, power source 502 includes a DC power source, such as an external AC to DC converter. In one example, power source 502 or power supply 504 includes wireless charging hardware to charge via proximity to a charging field. In one example, power source 502 can include an internal battery or fuel cell source.

In Example 1, a memory controller includes error correction circuitry to generate a plurality of erasure codewords from a codeword in response to detection of an uncorrectable error, the uncorrectable error being an error in the codeword that is uncorrectable with an error checking and correction (ECC) code, and to select a subset of the plurality of erasure codewords based on syndrome weights of the erasure codewords, and erasure decoder circuitry to compute the syndrome weights of the plurality of erasure codewords, and to perform erasure decoding with the subset of the plurality of erasure codewords in response to detection of the uncorrectable error.

In Example 2, the memory controller of example 1, wherein the codeword includes a group of elements obtained from a given memory partition, and wherein the error correction circuitry is to replace elements of the group of elements with erasures to generate an erasure codeword of the plurality of erasure codewords corresponding to the given memory partition.

In Example 3, the memory controller of any preceding example, wherein the codeword includes a group of elements obtained from a given memory die, and wherein the error correction circuitry is to replace elements of the group of elements with erasures to generate an erasure codeword of the plurality of erasure codewords corresponding to the given memory die.

In Example 4, the memory controller of any preceding example, wherein the error correction circuitry is to identify erasure codewords with smallest syndrome weights, and select the erasure codewords with the smallest syndrome weights as the subset of the plurality of erasure codewords to be decoded.

In Example 5, the memory controller of any preceding example, wherein the erasure decoder circuitry includes a low-density parity-check (LDPC) decoder.

In Example 6, the memory controller of any preceding example, wherein the erasure decoder circuitry is to compute the syndrome weight from the plurality of the erasure codewords and a low-density parity-check (LDPC) parity check matrix.

In Example 7, the memory controller of any preceding example, including storage circuitry to store the syndrome weights of the plurality of erasure codewords.

In Example 8, the memory controller of any preceding example, wherein a first erasure codeword of the subset of the plurality of erasure codewords is decoded before a second erasure codeword of the subset of the plurality of erasure codewords when the syndrome weight of the first erasure codeword is less than the syndrome weight of the second erasure codeword.

In example 9, a computer system including a processor, and a memory controller including error correction circuitry to generate a plurality of erasure codewords from a codeword in response to detection of an uncorrectable error, the uncorrectable error being an error in the codeword that is uncorrectable with an error checking and correction (ECC) code, and to select a subset of the plurality of erasure codewords based on syndrome weights of the erasure codewords and erasure decoder circuitry to compute the syndrome weights of the plurality of erasure codewords, and to perform erasure decoding with the subset of the plurality of erasure codewords in response to detection of the uncorrectable error.

In example 10, the computer system of example 9, wherein the codeword includes a group of elements obtained from a given memory partition, and wherein the error correction circuitry is to replace elements of the group of elements with erasures to generate an erasure codeword of the plurality of erasure codewords corresponding to the given memory partition.

In example 11, the computer system of any preceding example, wherein the codeword includes a group of elements obtained from a given memory die, and wherein the error correction circuitry is to replace elements of the group of elements with erasures to generate an erasure codeword of the plurality of erasure codewords corresponding to the given memory die.

In example 12, the computer system of any preceding example, wherein the error correction circuitry is to identify erasure codewords with smallest syndrome weights, and select the erasure codewords with the smallest syndrome weights as the subset of the plurality of erasure codewords to be decoded.

In example 13, the computer system of any preceding example, wherein the erasure decoder circuitry includes a low-density parity-check (LDPC) decoder.

In example 14, the computer system of any preceding example, wherein the erasure decoder circuitry is to compute the syndrome weight from the plurality of the erasure codewords and a low-density parity-check (LDPC) parity check matrix.

In example 15, the computer system of any preceding example, including storage circuitry to store the syndrome weights of the erasure codewords.

In example 16, the computer system of any preceding example, wherein a first erasure codeword of the subset of the plurality of erasure codewords is decoded before a second erasure codeword of the subset of the plurality of erasure codewords when the syndrome weight of the first erasure codeword is less than the syndrome weight of the second erasure codeword.

In example 17, a method includes detecting an uncorrectable error, wherein the uncorrectable error being an error in a codeword that is uncorrectable with an error checking and correction (ECC) code, receiving an indication that the uncorrectable error is detected, generating a plurality of erasure codewords from the codeword, generating syndrome weights of the plurality of erasure codewords, selecting a subset of the plurality of erasure codewords based on syndrome weights of the plurality of erasure codewords, and decoding the erasure codewords of the subset of the plurality of erasure codewords.

In example 18, the method of example 17, wherein generating an erasure codeword of the plurality of erasure codewords corresponding to a given memory partition to include replacing elements of the codeword obtained from the given memory partition with erasures.

In example 19, the method of any preceding example, wherein generating an erasure codeword of the plurality of erasure codewords corresponding to a given memory die to include replacing elements of the codeword obtained from the given memory die with erasures.

In example 18, the method of any preceding example, wherein decoding includes execution of an implementation of a low-density parity-check (LDPC) decoder.

Flow diagrams, as illustrated herein, provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, the order of the actions can be modified unless otherwise specified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon or via a method of operating a communication interface to send data via the communication interface. A machine-readable storage medium can cause a machine to perform the functions or operations described and includes any mechanism that stores information in a form accessible by a machine (e.g., computing device, electronic system, etc.), such as recordable/non-recordable media (e.g., read-only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application-specific hardware, application-specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative and not a restrictive sense. The scope of the invention should be measured solely by reference to the claims that follow.

What is claimed is:

1. A memory controller comprising:
   error correction circuitry
      to generate a plurality of erasure codewords from a codeword in response to detection of an uncorrectable error, the uncorrectable error being an error in the codeword that is uncorrectable with an error checking and correction (ECC) code, and
      to select a subset of the plurality of erasure codewords based on syndrome weights of the erasure codewords; and
   erasure decoder circuitry
      to compute the syndrome weights of the plurality of erasure codewords, and
      to perform erasure decoding with the subset of the plurality of erasure codewords in response to detection of the uncorrectable error.

2. The memory controller of claim 1, wherein the codeword comprises a group of elements obtained from a given memory partition, and wherein:
   the error correction circuitry is to replace elements of the group of elements with erasures to generate an erasure codeword of the plurality of erasure codewords corresponding to the given memory partition.

3. The memory controller of claim 1, wherein the codeword comprises a group of elements obtained from a given memory die, and wherein:
   the error correction circuitry is to replace elements of the group of elements with erasures to generate an erasure codeword of the plurality of erasure codewords corresponding to the given memory die.

4. The memory controller of claim 1, wherein:
the error correction circuitry is to identify erasure codewords with smallest syndrome weights, and select the erasure codewords with the smallest syndrome weights as the subset of the plurality of erasure codewords to be decoded.

5. The memory controller of claim 1, wherein the erasure decoder circuitry comprises a low-density parity-check (LDPC) decoder.

6. The memory controller of claim 5, wherein:
the erasure decoder circuitry is to compute the syndrome weight from the plurality of the erasure codewords and a low-density parity-check (LDPC) parity check matrix.

7. The memory controller of claim 1, comprising:
storage circuitry to store the syndrome weights of the plurality of erasure codewords.

8. The memory controller of claim 1, wherein:
a first erasure codeword of the subset of the plurality of erasure codewords is decoded before a second erasure codeword of the subset of the plurality of erasure codewords when the syndrome weight of the first erasure codeword is less than the syndrome weight of the second erasure codeword.

9. A computer system comprising:
a processor; and
a memory controller including:
error correction circuitry
to generate a plurality of erasure codewords from a codeword in response to detection of an uncorrectable error, the uncorrectable error being an error in the codeword that is uncorrectable with an error checking and correction (ECC) code, and
to select a subset of the plurality of erasure codewords based on syndrome weights of the erasure codewords and erasure decoder circuitry
to compute the syndrome weights of the plurality of erasure codewords, and
to perform erasure decoding with the subset of the plurality of erasure codewords in response to detection of the uncorrectable error.

10. The computer system of claim 9, wherein the codeword comprises a group of elements obtained from a given memory partition, and wherein:
the error correction circuitry is to replace elements of the group of elements with erasures to generate an erasure codeword of the plurality of erasure codewords corresponding to the given memory partition.

11. The computer system of claim 9, wherein the codeword comprises a group of elements obtained from a given memory die, and wherein:
the error correction circuitry is to replace elements of the group of elements with erasures to generate an erasure codeword of the plurality of erasure codewords corresponding to the given memory die.

12. The computer system of claim 9, wherein:
the error correction circuitry is to identify erasure codewords with smallest syndrome weights, and select the erasure codewords with the smallest syndrome weights as the subset of the plurality of erasure codewords to be decoded.

13. The computer system of claim 9, wherein the erasure decoder circuitry comprises a low-density parity-check (LDPC) decoder.

14. The computer system of claim 13, wherein:
the erasure decoder circuitry is to compute the syndrome weight from the plurality of the erasure codewords and a low-density parity-check (LDPC) parity check matrix.

15. The computer system of claim 9, comprising:
storage circuitry to store the syndrome weights of the erasure codewords.

16. The computer system of claim 9, wherein:
a first erasure codeword of the subset of the plurality of erasure codewords is decoded before a second erasure codeword of the subset of the plurality of erasure codewords when the syndrome weight of the first erasure codeword is less than the syndrome weight of the second erasure codeword.

17. A method comprising:
detecting an uncorrectable error, wherein the uncorrectable error being an error in a codeword that is uncorrectable with an error checking and correction (ECC) code;
receiving an indication that the uncorrectable error is detected;
generating a plurality of erasure codewords from the codeword;
generating syndrome weights of the plurality of erasure codewords;
selecting a subset of the plurality of erasure codewords based on syndrome weights of the plurality of erasure codewords; and
decoding the erasure codewords of the subset of the plurality of erasure codewords.

18. The method of claim 17, wherein:
generating an erasure codeword of the plurality of erasure codewords corresponding to a given memory partition to include replacing elements of the codeword obtained from the given memory partition with erasures.

19. The method of claim 17, wherein:
generating an erasure codeword of the plurality of erasure codewords corresponding to a given memory die to include replacing elements of the codeword obtained from the given memory die with erasures.

20. The method of claim 17, wherein decoding includes execution of an implementation of a low-density parity-check (LDPC) decoder.

* * * * *